United States Patent [19]
Sondermeyer

[11] 4,318,053
[45] Mar. 2, 1982

[54] AMPLIFIER SYSTEM WITH AUTOMATIC DISTORTION CONTROL

[75] Inventor: Jack C. Sondermeyer, Meridian, Miss.

[73] Assignee: Hartley D. Peavey, Meridian, Miss.

[21] Appl. No.: 96,317

[22] Filed: Nov. 21, 1979

[51] Int. Cl.³ .............................................. H03G 3/30
[52] U.S. Cl. ...................................... 330/281; 330/2; 330/279
[58] Field of Search ................... 330/2, 136, 141, 144, 330/145, 129, 110, 279, 281, 284

[56] References Cited
U.S. PATENT DOCUMENTS
4,048,573 9/1977 Evans et al. ............................. 330/2

*Primary Examiner*—James B. Mullins
*Attorney, Agent, or Firm*—Victor J. Evans & Co.

[57] ABSTRACT

An amplifier system with automatic distortion control including an amplifier provided with a detector between the amplifier output and feedback ports for detecting a nonlinear condition with a balanced differential circuit connected to the detector and feeding a full wave threshold detector which charges a storage capacitor proportionally to the percent clipping of the output signal of the amplifier. The storage capacitor is discharged into an input variable gain amplifier in the amplifier input circuit to reduce the gain for minimizing clipping.

10 Claims, 1 Drawing Figure

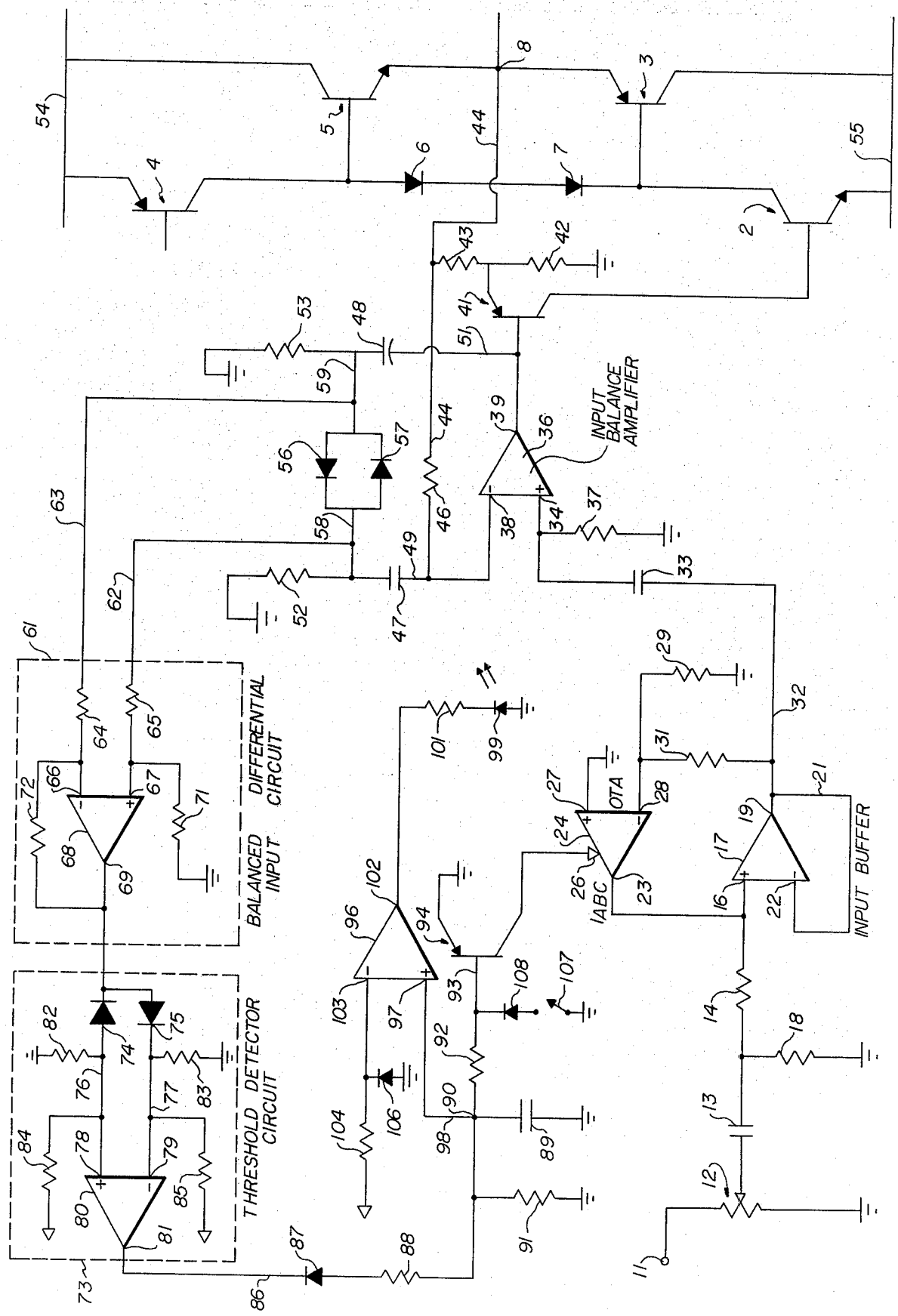

AMPLIFIER SYSTEM WITH AUTOMATIC DISTORTION CONTROL

BACKGROUND OF THE INVENTION

In the present day design of power amplifiers for driving loudspeakers and the like, the common practice is to utilize an operational amplifier in the front end of the audio system. The advantages of utilizing such an operational amplifier include the permissible use of high levels of feedback, the production of very low output off-set voltages, and a relatively high input impedance. This impedance remains constant with overload and frequency variation. In addition, the use of an operational amplifier provides an economic advantage since it is available in a single integrated circuit. However, as a typical integrated circuit has relatively low supply limits, a transistor gain stage must be utilized following the operational amplifier to bring the signal level up for driving the traditional emitter follower type circuits of the complementary or quasi-complementary designs. In such circuit designs, it is quite common to find supply voltages at eighty volts or higher. Now the operational amplifier will remain in the linear mode as long as the output of the power amplifier follows the input signal in a nondistorted manner.

In high-powered audio design, it is extremely advantageous to prevent the power amplifier from "clipping" which causes an extremely harsh sounding square wave to be delivered to the speaker system. These square waves are clipped sine waves and the flat top portion of these clipped wave forms represent D.C. delivered to the speaker system. These square waves, producing excessive RMS power levels, substantially increase the probability of damage to the loudspeaker because of the increased heat dissipation as well as requiring the diaphragms of the speakers to change directions almost instantaneously because of the steep wave form instead of the more gradual movement allowed for by the sine wave type reproduction.

If output clipping takes place because signal conditions exceed supply voltages or V/I limiting circuits become operational due to overloads or short circuits or slew rate limiting occurs on high slewing type signals, the input amplifier will immediately generate a nonlinear signal which will cause the output of the operational amplifier to swing to either supply rail and stay there until signal conditions are again linear. Once linear operation is established, the operational amplifier must recover at its slew rate speed back to near "0" to regain control of the amplifier. During this time, there is a so-called "dead zone" which is a nonlinear type situation presenting a common problem generally referred to as transient intermodulation (T.I.M.) distortion. To minimize such signal distortion, it is necessary to prevent the operational amplifier from going to the supply rails which is a relatively difficult action to prevent. Some progress toward solving this distortion problem has been obtained by adjusting the gain stage to have the same gain stage as the feedback network feeding the operational amplifier so that the operational amplifier will then operate at unity gain, i.e., the input port, feedback port, and output port are all at the same signal level as long as linear operation is maintained. Then, after decoupling to achieve "0" D.C. conditions, a pair of silicon diodes connected in oppositely poled relationship is connected between the operational amplifier output port to the feedback port. Thus, with this arrangement, when the operational amplifier will take less time to recover so that significantly less T.I.M. distortion is encountered. However, while such a system provides a partial solution to signal distortion, there still remains the problem of amplifier clipping caused by overdrive conditions which produce undesirable audible distortion for which no solution has been provided in present-day amplifier systems.

OBJECTS AND SUMMARY OF THE INVENTION

Accordingly, a primary object of this invention is to provide a new and novel amplifier system which operates in the linear mode under conditions of serious overdrive.

Another object of this invention is to provide a new and novel amplifier system for eliminating distortion in the output signal which operates in an automatic manner, thereby eliminating the time consuming adjustment and control common to present-day compression circuits.

A further object of this invention is to provide a new and novel amplifier system which prevent the power amplifier output signal from being clipped under overdrive conditions as in live music situations or when a microphone is dropped or the like.

A still further object of this invention is to provide a new and novel amplifier system which automatically eliminates distortion in the power amplifier output signal, which is simple and inexpensive in construction, which utilizes readily available component parts and which is capable of prolonged use without adjustment or maintenance.

Still another object of this invention is to provide a new and novel amplifier system for automatically producing a nondistorted output signal from a power amplifier while permitting relatively short bursts of signal clipping to occur and which indicates visually the period during which signal distortion is being corrected.

The objects of the invention and other related objects are accomplished by providing an operational amplifier having a feedback network with detecting means connected between the output port and the feedback port of the operational amplifier for providing a differential output signal in the nonlinear operating condition. A balanced differential circuit is connected to the detecting means for providing an amplified output signal which is fed to a full wave threshold detector circuit, the output of which is used to charge a storage capacitor. The charge on the storage capacitor, which is proportional to the percent clipping of the output signal of the entire amplifier system in the nonlinear condition, is applied to a variable gain amplifier in the input circuit of the amplifier system as the storage capacitor charges to reduce the gain of the input signal and thereby minimizes the clipping of the power amplifier output system.

The invention will be better understood as well as further objects and advantages thereof become apparent from the ensuing detailed description of the preferred embodiment when taken in conjunction with the drawing.

BRIEF DESCRIPTION OF THE DRAWING

The single FIGURE of the drawing is a schematic diagram of the amplifier system of the invention.

DESCRIPTION OF THE PREFERRED EMBODIMENT

Referring now to the single FIGURE of the drawing, there is shown an amplifier system in accordance with the invention which is provided with an input terminal 11 by means of which an input signal is applied to the system. The input terminal 11 is connected thrugh a potentiometer 12 to a coupling capacitor 13 and through a resistor 14 to the noninverting input 16 of an input buffer amplifier 17. Resistor 18 is connected at one side between capacitor 13 and resistor 14 and at the other side to ground.

Buffer amplifier 17 has an output terminal 19 connected in a feedback path by means of conductor 21 to the inverting input 22 and the noninverting input 16 of the buffer amplifier 17 is connected to the output 23 of an operational transconductance amplifier (O.T.A.) 24 representing a variable gain stage. The variable gain amplifier 24 is provided with an input terminal 26 ($I_{ABC}$) and its noninverting input 27 is connected to ground. The inverting input 28 of the variable gain amplifier 24 is connected by resistor 29 to ground and by resistor 31 to a conductor 32 connected to the output terminal 19 of the buffer amplifier 17.

The output 19 of buffer amplifier 17 is connected by means of the conductor 32 through a coupling capacitor 33 to the noninverting input 34 of an input balance amplifier 36. The input 34 is also connected to ground by means by resistor 37. The input balance amplifier 36 is provided with an inverting input 38 and an output 39, the inverting input 38 forming the feedback port for the entire amplifier system.

In order to amplify the output signal from the input balance amplifier 36, a transistor gain stage comprising transistor 41 is provided, the base of which is connected to the output 39 of the input balance amplifier 36. The emitter of transistor 41 is connected through resistor 42 to ground and through resistor 43 to conductor 44 which is the output buss of the entire amplifier system, thereby forming one internal feedback network. Resistor 46 is connected from conductor 44 to the feedback input port 38 of the input balance amplifier 36, thereby forming the major feedback network. Capacitors 47 and 48 are connected by means of conductors 49,51 to the feedback port 38 and the output port 39, respectively, for decoupling to achieve "0" D.C. conditions. The other side of capacitors 47,48 are connected through resistors 52,53, respectively, to ground. Additionally, resistor 52 acts to set overall system gain with its ratio to resistor 46.

The collector of transistor 41 is connected to subsequent stages associated with the amplifier system of the invention which may be of conventional design including transistors 2-5 and diodes 6-7 with conductor 44 connected into the associated circuitry at a junction 8 at which the amplifier system output signal appears. The circuitry associated with the amplifier system of the invention is connected to supply rails 54,55.

The transistor gain stage including transistor 41 is adjusted to have the same gain as the overall system gain as determined by the feedback network feeding the input balance amplifier 36. This is accomplished by providing the same ratio of resistors 46 to 52 as that ratio of the transistor gain stage resistors 43 to 42. By this adjustment, the input balance amplifier 36 will operate at unity gain; i.e., the input port 34, the feedback port 38, and the output port 39 are all at the same signal level as long as linear operation is maintained. After the decoupling by capacitors 47,48, a pair of oppositely poled diodes 56,57 arranged in parallel relationship are connected by means of conductors 58,59 to conductors 49,51, respectively, so that the diodes 56,57 are disposed between the output port 39 and the feedback port 38 of the input balance amplifier 36. Thus, when the input balance amplifier 36 attempts to go toward its power supply rails, the diodes 56,57 will limit it in each direction to 1 $V_{BE}$(0.6 volts). Obviously, the input balance amplifier 36 will take less time to recover from this situation and thus significantly less T.I.M. distortion is encountered.

As specifically illustrative of the invention, a balanced differential input circuit shown in broken lines and designated generally by the reference numeral 61 has its input connected across the limiting diodes 56,57 by means of conductors 62,63. These conductors 62,63 are connected through resistors 64,65 to the inverting input 66 and the noninverting input 67, respectively, of an amplifier 68 having an output port 69. The noninverting input 67 is connected through resistor 71 to ground and a feedback network including resistor 72 is connected between the amplifier input 66 and output 69. Thus, the differential input circuit 61 includes two input resistors 64,65 and two output resistors, 71,72.

As explained above, the input balance amplifier 36 operates at unity gain and therefore the signal at the input terminals 66,67 of the differential circuit 61 will be the same as long as the input balance amplifier 36 remains linear and thus the common mode rejection of the differential circuit 61 will not pass any signal. Now if the input balance amplifier goes nonlinear for any reason, the signals at the two input terminals 66,67 will be different and this difference signal will be amplified by the differential circuit 61 producing an output at the amplifier output 69 which is proportional to the percent clipping.

The amplifier system of the invention includes a full wave threshold detector circuit shown in broken lines in the single FIGURE of the drawing and designated generally by the reference numeral 73. The threshold detector circuit 73 has its input connected to the output 69 of the amplifier 68 and this input includes two oppositely poled diodes 74,75 connected by means of conductors 76,77 to the noninverting input 78 and the inverting input 79, respectively, of an amplifier 80 having an output 81. Conductors 76,77 are connected through resistors 82, 83 to ground and through resistors 84,85 to positive and negative voltage sources, respectively, as shown. The threshold detector circuit 73 has approximately a one-volt activator level in either polarity direction.

The output 81 of the threshold detector circuit 73 is connected by means of conductor 86 through a diode 87 and resistor 88 to one side of a capacitor 89 at junction 90 and the other side of the capacitor 89 is connected to ground. When the threshold detector circuit 73 is activated by a signal from the differential circuit 61, the detector circuit 73 produces a negative voltage on capacitor 89 which voltage is proportional to percent clipping or distortion. Resistor 88 limits the "attack time" of the voltages stored on capacitor 89, permitting short bursts of clipping to take place.

A resistor 91 is connected between conductor 86 and ground which serves as a bleed resistor to drain the capacitor 89 back to "0" thereby setting the "decay time."

The voltage stored in capacitor 89 discharges through resistor 92 and is applied through conductor 93 to the base of a transistor 94 to bias the transistor on. Transistor 94, whose emitter is grounded, supplies current from its collector to the $I_{ABC}$ terminal 26 of the operational transconductance amplifier 24. The O.T.A. variable gain stage provided by amplifier 24 together with buffer amplifier 17 is designed to provide a variable load on the input resistor 14 to reduce the gain of the input circuit in accordance with the signal developed across the diodes 56, 57 thereby minimizing clipping in the output signal of the complete power amplifier system. To indicate the operation of the compression action of the distortion detection operation of the amplifier system of the invention, an amplifier 96 is provided having its noninverting input 97 connected through conductor 98 to the junction point 90 at one side of the capacitor 89. When a voltage exists on the storage capacitor 89, this amplifier 96 activates a LED 99 connected through resistor 101 to the output 102 of amplifier 96 to indicate this compression action. The inverting input 103 of amplifier 96 is connected through resistor 104 to a negative source of voltage and through a diode 106 to ground.

If it is desired to deactivate the distortion detection system of the invention, a switch 107 is provided which is connected through a diode 108 to conductor 93 so that when the switch is in the closed position, the transistor 94 becomes inoperative thereby preventing the O.T.A. amplifier 24 from accomplishing gain reduction. Nevertheless, the detection system of the invention continues to function with the LED 99 indicating non-linear (clipping) operation.

The amplifier system of the invention is therefore activated when any nonlinear output condition exists at conductor 44. This may be produced by events such as clipping (running into rail voltages), current limiting, slew rate limiting, or any combination of these. Attack time for distortion elimination is relatively slow (fifty milliseconds or more) which allows full music power capability, and short clipping transients are ignored. Decay time depends upon the amount of gain reducton requied to maintain linear operation (one-half second or more).

During sustained compression operaton, full RMS continuous power output capability will be maintained with sine wave distortion of less than one percent THD regardless of load impedance or mains voltage variation. The system of the invention is actually used to measure full RMS power output capability of the amplifier during system check-out. With compression action defeated with the use of switch 107, the system continues to function with the LED 99 indicating the "need for gain reduction" or "clipping." Only the actual gain reduction mechanism itself is defeated in the closed condition of switch 107.

What is claimed is:

1. An amplifier system for driving a loudspeaker or the like comprising, in combination, an operational amplifier having an input port, an outlet port, a feedback port and a feedback network connected between said output port and said feedback port, detecting means connected between said output port and said feedback port for providing a differential output signal in the non-linear operating condition of said operational amplifier proportional to the percent clipping of the output signal of said operational amplifier in said non-linear condition, a balanced differential circuit connected to said detecting means for providing an amplified output signal in response to said differential output signal, a storage capacitor, a full wave threshold detector circuit connected to said differential circuit and to said storage capacitor for charging said storage capacitor in response to said amplified output signal from said differential circuit, input circuit means including a variable gain amplifier for applying an input signal to said operational amplifier input port and means for applying current corresponding to the voltage stored in said storage capacitor to said variable gain amplifier to reduce the gain of said input signal for minimizng the clipping and therefore the distortion of said operational amplifier output signal.

2. An amplifier system in accordance with claim 1 including a resistor connected between said full wave threshold circuit and said storage capacitor for limiting the attack time of the voltage stored in said capacitor thereby permittng short bursts of clipping of said operational amplifier output signal.

3. An amplifier system in accordance with claim 1 including means for sensing the existence of voltage stored in said capacitor and display means connected to said sensing means.

4. An amplifier system in accordance with claim 1 wherein said means for applying current to said variable gain amplifier comprises a transistor having an input connected to said capacitor and an output connected to said variable gain amplifier.

5. An amplifier system in accordance with claim 4 including switch means for bypassing the connection between said transistor input and said capacitor thereby inoperatively conditioning said transistor.

6. An amplifier system in accordance with claim 1 including an output buss and wherein said feedback network includes a transistor having a base connected to said operational amplifier output port and having an emitter connected to said output buss.

7. An amplifier system in accordance with claim 6 wherein said detecting means include a pair of diodes connected in oppositely poled, parallel relationship, means including a decoupling capacitor for connecting opposite sides of said pair of diodes to said operational amplifier feedback port and said output port respectively.

8. An amplifier system in accordance with claim 7 including a bleed resistor connected on one side between a limiting resistor and said storage capacitor and on the other side to ground for draining said storage capacitor to thereby set a decay time for said storage capacitor.

9. An amplifier system in accordance with claim 8 wherein said balanced differential circuit comprises an amplifier having a pair of inputs and an output, a pair of input resistors each connected between one of said inputs and a respective side of said pair of diodes, a pair of output resistors, one of said resistors connected between one of said amplifier inputs and said amplifier output and the other of said output resistors connected between the other of said amplifier inputs and ground.

10. An amplifier system in accordance with claim 9 wherein said full wave threshold detector circuit includes a pair of diodes disposed in oppositely poled relationship and having one side connected to said amplifier output in said balanced differential circuit, an amplifier having an output connected to said limiting resistor and a pair of inputs each connected to the other side of a respective one of said diodes, a first pair of resistors each connected to a respective one of said inputs and ground and a second pair of resistors each connected to a respective one of said inputs and to an associated source of positive and negative voltages respectively.

* * * * *